(12) United States Patent
Devlin et al.

(10) Patent No.: US 9,531,351 B1
(45) Date of Patent: Dec. 27, 2016

(54) CONFIGURABLE LATCH CIRCUIT

(71) Applicant: Xilinx, Inc., San Jose, CA (US)

(72) Inventors: Benjamin S. Devlin, San Francisco, CA (US); Ilya K. Ganusov, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/835,571

(22) Filed: Aug. 25, 2015

(51) Int. Cl.
  *H03K 3/289* (2006.01)
  *H03K 3/037* (2006.01)

(52) U.S. Cl.
  CPC .................................. *H03K 3/0372* (2013.01)

(58) Field of Classification Search
  None
  See application file for complete search history.

(56) References Cited

U.S. PATENT DOCUMENTS

| | | | |
|---|---|---|---|
| 7,233,184 B1 | 6/2007 | Nguyen | |
| 8,717,078 B2 * | 5/2014 | Idgunji | H03K 3/0375 327/202 |
| 8,841,952 B1 * | 9/2014 | Singh | H03K 3/0375 327/202 |
| 8,866,527 B1 * | 10/2014 | Lewis | H03K 3/012 327/202 |
| 8,994,424 B2 * | 3/2015 | Dinh | H03K 5/159 327/141 |
| 2007/0063752 A1 * | 3/2007 | Kowalczyk | H03K 3/037 327/202 |

OTHER PUBLICATIONS

U.S. Appl. No. 14/792,953, Devlin et al., filed Jul. 7, 2015, San Jose, CA USA.
U.S. Appl. No. 14/792,894, Ganusov et al., filed Jul. 7, 2015, San Jose, CA USA.

* cited by examiner

*Primary Examiner* — Long Nguyen
(74) *Attorney, Agent, or Firm* — LeRoy D. Maunu; Jonathan Soike (57) ABSTRACT

In an example implementation, a circuit includes first and second latch circuits. A circuit coupled to the first and second latch circuits is configured to provide a first clock signal to the clock input node of the second latch circuit and provide a second clock signal that is an inversion of the first clock signal to the clock input node of the first latch circuit. The circuit includes a first multiplexer having a first input node coupled to a data output node of the first latch circuit, a second input node coupled to a data input node of the first latch circuit, and an output node coupled to a data input node of the second latch circuit. The circuit also includes a second multiplexer having a first input node coupled to the data output node of the first latch circuit and a second input node coupled to a data output node of the second latch circuit.

20 Claims, 6 Drawing Sheets

FIG. 8

CONFIGURABLE LATCH CIRCUIT

FIELD OF THE INVENTION

The disclosure generally relates to latches, and more particularly to edge-triggered latches.

BACKGROUND

Modern digital circuits, whether implemented in integrated circuits (IC) or in discrete form, often utilize data latches. One type of latch, referred to as a level-sensitive latch, provides an output signal having a state that depends upon the activity of the dock signal that is present at a dock input node. In particular, the logic value of the output signal of the level-sensitive latch reflects the logic value of the signal at the input node during a portion of the input dock cycle. In this phase of operation, the latch passes logic values present at its input node directly to its output node. A latch operating in this phase may be referred to as being transparent. In a second phase of operation, the level-sensitive latch maintains the output signal at a fixed logic value during the remaining portion of the input dock cycle, regardless of the logic value present at the input node. A latch operating in the second phase may be referred to as being latched.

Another type of latch, referred to as an edge-triggered latch, is configured to set and hold an output signal to a logic value present at an input node during an edge of a dock signal provided to a dock input node. One implementation of an edge-triggered latch includes a combination of two level-sensitive latches. The first level-sensitive latch, i.e., the master stage, is transparent during a first phase of the input clock, while the second level-sensitive latch, i.e., the slave stage, is transparent during a second phase of the input dock. The combined behavior is such that the input data is captured and passed to the output node only when the dock signal exhibits a low-to-high logic transition. The value of the output signal is maintained until the next low-to-high transition of the dock signal. Conversely, the configuration of the two level-sensitive latches may be altered to capture input data during a high-to-low logic transition of the dock signal.

SUMMARY

Various example implementations are directed to circuits and methods for dual-edge-triggered latching of a data signal. In an example implementation, a circuit includes first and second latch circuits. Each of the latch circuits has a respective data input node, a respective data output node, and a respective clock input node. Each latch circuit is configured to set a value of the respective data output node to a value of the data input node while the respective clock input node is set to a first value (e.g., logic 1). Each latch circuit is also configured to hold the value of the data output node while the respective clock input node is set to a second value (e.g., logic 0). A circuit coupled to the first and second latch circuits is configured to provide a first clock signal to the clock input node of the second latch circuit and provide a second clock signal that is an inversion of the first clock signal to the clock input node of the first latch circuit. The circuit includes a first multiplexer having a first input node coupled to the data output node of the first latch circuit, a second input node coupled to the data input node of the first latch circuit, and an output node coupled to the data input node of the second latch circuit. The circuit also includes a second multiplexer having a first input node coupled to the data output node of the first latch circuit and a second input node coupled to the data output node of the second latch circuit.

A method is also disclosed for dual-edge-triggered latching of a data signal. A data input node of a first latch and a data input node of a second latch are coupled to an input junction configured to receive the data signal. While a clock signal is set to a first value, the first latch is used to latch a data output node of the first latch to a value present at a data input node of the first latch. The latched value is the value present at the data input node during a transition of the clock signal from the second value to the first value (e.g., a rising edge). While the clock signal is set to a first value, the second latch is used to latch a data output node of the second latch to a value present at a data input node of the second latch during a transition of the clock signal from the first value to the second value. The data output node of the first latch is coupled to an output terminal in response to the clock signal being set to the first value. The data output node of the second latch is coupled to the output terminal in response to the clock signal being set to the second value.

A programmable integrated circuit (IC) is also disclosed. The programmable IC includes programmable logic circuits and programmable interconnect circuits. The programmable IC includes a configuration controller configured to program the programmable logic circuits and programmable interconnect circuits according to a set of configuration data stored in a non-volatile memory coupled to the programmable IC. The programmable logic circuits include a configurable latch circuit. The configurable latch circuit includes first and second latch circuits. Each of the latch circuits has a respective data input node, a respective data output node, and a respective clock input node. Each latch circuit is configured to set a value of the respective data output node to a value of the data input node while the respective clock input node is set to the first value. Each latch circuit is also configured to hold the value of the data output node while the respective clock input node is set to the second value. A circuit coupled to the first and second latch circuits is configured to provide a first clock signal to the clock input node of the second latch circuit and provide a second clock signal that is an inversion of the first clock signal to the clock input node of the first latch circuit. The circuit includes a first multiplexer having a first input node coupled to the data output node of the first latch circuit, a second input node coupled to the data input node of the first latch circuit, and an output node coupled to the data input node of the second latch circuit. The circuit also includes a second multiplexer having a first input node coupled to the data output node of the first latch circuit and a second input node coupled to the data output node of the second latch circuit.

Other features will be recognized from consideration of the Detailed Description and Claims, which follow.

BRIEF DESCRIPTION OF THE DRAWINGS

Various aspects and features of the circuits and methods will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Circuits and methods are disclosed for dual-edge-triggered latching of data signals. Dual-edge-triggered latches sample and latch data values at a rising edge of a clock signal as well as at a falling edge of the clock signal. As a result, data values can be sampled at twice the rate of a clock signal. In some applications, dual-edge-triggered latching may be used to reduce the clock rate needed for a given sampling rate. Reducing the clock rate may provide significant power savings, for example, in applications having active circuitry in clock distribution networks.

Existing dual-edge-triggered latching techniques generally required additional latch circuits, which increase semiconductor die area and consume additional power. For example, some dual-edge triggered latching techniques utilize a parallel arrangement of two single-edge-triggered latches. In particular, a serial data stream may be demultiplexed into two serial data streams. A first edge-triggered latch samples and latches, for example, the even bits of the serial data stream in response to a rising edge of a dock. A second edge-triggered latch samples and latches the odd bits of the serial data stream in response to falling edges of the dock. After the two edge-triggered latches have latched their respective data bits, the data bits may be retrieved from each latch and then re-combined into a single data stream. This approach generally requires four level-sensitive latches to implement master and slave latches for each of the two single-edge-triggered latches.

Another approach for dual-edge triggered latching uses two master stage latches and a third latch that operates as a shared slave stage. A first one of the master stage latches is configured to latch an input data signal at its output node in response to a first phase of a clock signal. A second one of the master stage latches is configured to latch an input data signal at its output node in response to a second phase of the clock signal. During the first phase of the clock signal, a third latch is coupled to the output node of the first master stage latch and operates as a slave latch for the first master stage latch. During the second phase of the clock signal, the third latch is coupled to the output node of the first master stage latch and operates as a slave latch for the second master stage latch.

Various circuits and methods are disclosed for dual-edge latching using fewer latches in comparison to previous approaches. As circuit designs often include a large number of latching circuits, the disclosed dual-edge latching circuits may provide significant reduction in semiconductor die area and power consumption. In an example implementation, a configurable latch circuit includes first and second level-sensitive latch circuits. As previously indicated, the state of the output signal of a level-sensitive latch circuit follows the value of an input node of the latch circuit when an input clock signal is at a first value (e.g., logic 1), and holds its current value when the input clock signal is at a second value (e.g., logic 0). The clock signal is provided to the clock input node of the second latch and an inverted clock signal is provided to the clock input node of the first latch.

The configurable latch circuit also includes a set of multiplexers that may be configured to interconnect the first and second latch circuits to form various types of latching circuits. Using the multiplexers, the two level-sensitive latch circuits may be configured to operate as a number of different latches including, for example, a dual-edge-driven latch, a single-edge-driven latch, and/or a level sensitive latch. In some implementations, the set of multiplexers are configured to interconnect and operate the first and second latch circuits as a single-edge-triggered latch in a first mode and as a double-edge-triggered latch in a second mode.

In an example implementation, the input node of the first level-sensitive latch is coupled to an input junction. A first multiplexer is configured to couple an input node of the second level-sensitive latch to the input junction or to an output node of the first level-sensitive latch. A second multiplexer is configured to couple an output terminal to either the output node of the first level-sensitive latch or the output node of the second level-sensitive latch.

To operate the latch circuits as a single-edge-triggered latch, the first multiplexer couples the input node of the second level-sensitive latch to the output node of the first level-sensitive latch and the second multiplexer couples the output node of the second level-sensitive latch to the output terminal. When the clock signal is set to a first value (e.g., logic 1), the first latch holds the current value of the input junction and the second latch is transparent. When the clock signal is set to a second value (e.g., logic 0), the output node of the second latch is held at the value held by the first latch and the first latch then becomes transparent. The combined operation of the latches sets the output terminal to the value of the input junction in response to a rising edge of the clock signal, and holds the value of the output terminal until the next rising edge of the clock signal. Conversely, the latches may be adapted to set and hold the output terminal to the value of the input junction in response to a falling edge of the clock signal by swapping the clock signals provided to the clock input nodes of the first and second latches.

To operate the first and second level-sensitive latches as a double-edge-triggered latch the first multiplexer couples the input node of the second level-sensitive latch to the input junction. When the clock signal is set to logic 1, the first level-sensitive latch is transparent, and the output node of the second level-sensitive latch is held. When the clock signal is set to logic 0, the second level-sensitive latch is transparent and the output node of the first level-sensitive latch is held. The second multiplexer is configured to connect the output terminal to the output node of the one of the first or second level-sensitive latches that is held. In this manner, the transparent behavior of the level-sensitive latches is hidden from the output terminal. The combined operation of the latches and the second multiplexer sets the output terminal to the value of the input junction in response to a rising or falling edge of the clock signal, and holds the value of the output terminal until the next rising or falling edge of the clock signal.

In some implementations, the configurable latch circuit includes a third multiplexer for selective coupling of various data signals to the input junction. For example, the third multiplexer may be configured to provide a first data signal from an input terminal to the input junction in response to an input control signal having a first value and provide a second data signal from the output terminal to the input junction in response to the input control signal having a second value.

Figure 1:
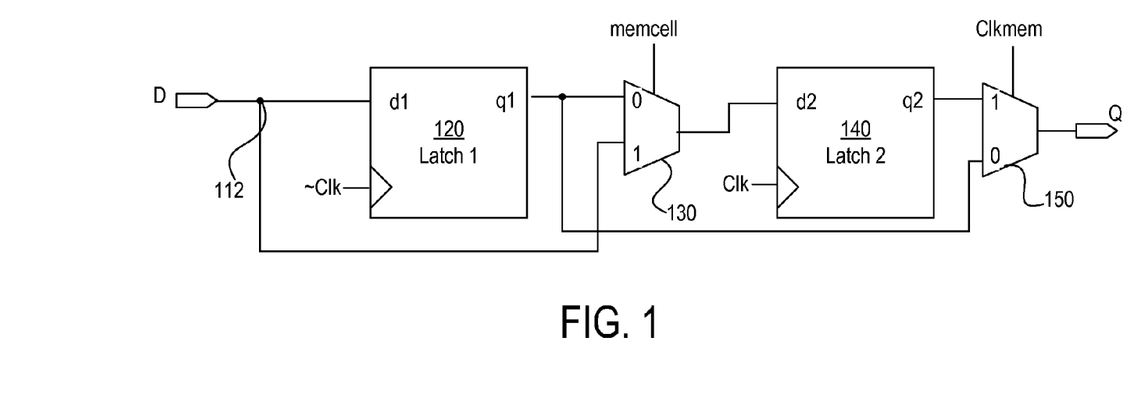
FIG. 1 shows a first configurable latch circuit, consistent with one or more implementations.

Turning now to the figures, FIG. 1 shows a first configurable latch circuit, consistent with one or more implementations. The configurable latch circuit includes first and second level-sensitive latch circuits 120 and 140. In this example, the configurable latch circuit also includes two multiplexers 130 and 150 for reconfiguring connections of the first and second latch circuits to form different latching circuits. Responsive to a first control signal (Memcell), a first multiplexer 130 selectably couples the input node (d2) of the second latch 140 to the output node (q1) of the first latch 120 or to an input junction 112. In this example, the input junction is coupled to receive an input data signal from an input terminal (D) of the configurable latch circuit. Responsive to a second control signal (Clkmem), a second multiplexer 150 selectably couples an output terminal (Q) of the configurable latch circuit to either an output node (q1) of the first latch 120 or an output node (q2) of the second latch 140.

By adjusting the control signals (Memcell and Clkmem), the latch circuits may be interconnected to form various latching circuits including, for example, a dual-edge-driven latch, a single-edge-driven latch, and/or a level sensitive latch. For example, the latch circuits 120 and 140 may be configured to operate as a single-edge-triggered latch by configuring the first multiplexer 130 to couple the input node d2 of the second latch 140 to the output node q1 of the first latch 120 and configuring the second multiplexer 150 to couple the output node q2 of the second latch 140 to the output terminal Q. In this arrangement, when the clock signal is set to logic 1, the first latch 120 becomes latched and the second latch 140 becomes transparent. Conversely, when the clock signal is set to logic 0, the second latch 140 becomes latched and the first latch 120 becomes transparent. In this arrangement, the combined operation of the latches 120 and 140 set and hold the output terminal Q to the value present at the input terminal D when the clock signal exhibits a rising edge. The latches 120 and 140 may be adapted to instead set and hold the output terminal Q at falling edges of the clock signal by swapping the clock signals provided to the clock input nodes of the first and second latches.

As yet another example, the latch circuits 120 and 140 may be configured to operate as a double-edge-triggered latch by configuring the first multiplexer 130 to couple the input node d2 of the second latch 140 to the input junction 112 and configuring the second multiplexer 150 to couple the output terminal whichever one of the latches 120 and 140 is operating in a latched state. As the output terminal is always coupled to a latch operating in a latched state, the transparent behavior of the level-sensitive latches is hidden from the output terminal. In this arrangement, the combined operation of the latches 120 and 140 set and hold the output terminal Q to the value present at the input terminal D when the clock signal exhibits either a rising or falling edge.

Figure 2:
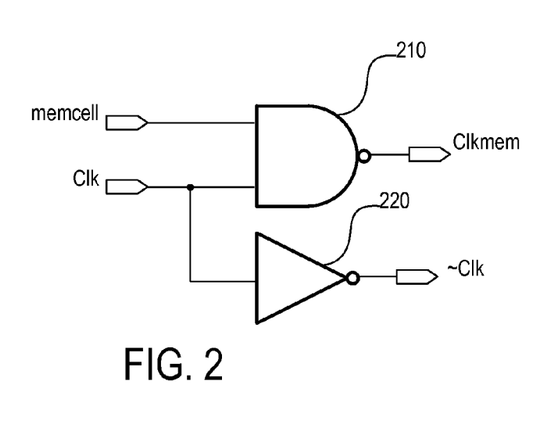
FIG. 2 shows an example circuit for controlling output of the configurable latch circuit in FIG. 1, consistent with one or more implementations.

FIG. 2 shows an example circuit for controlling output of the configurable latch circuit in FIG. 1, consistent with one or more implementations. The circuit is configured to generate a control signal Clkmem for controlling selection of the second multiplexer 150 as a function of the clock signal Clk and control signal memcell. Table 1 shows a truth table for illustrating the value of Clkmem for different values of memcell and clk. In this example, the Clkmem signal is generated using a logical NAND gate 210 having a first input node coupled to receive the memcell control signal and a second input node coupled to receive the clock signal Clk. In this example, the circuit also includes an inverter 220 to generate the inverted clock ~Clk used to enable latching of latch 120 in FIG. 1.

TABLE 1

| Memcell | Clk | Clkmem |
|---------|-----|--------|
| 0 | 0 | 1 |
| 0 | 1 | 1 |
| 1 | 0 | 1 |
| 1 | 1 | 0 |

Figure 3:
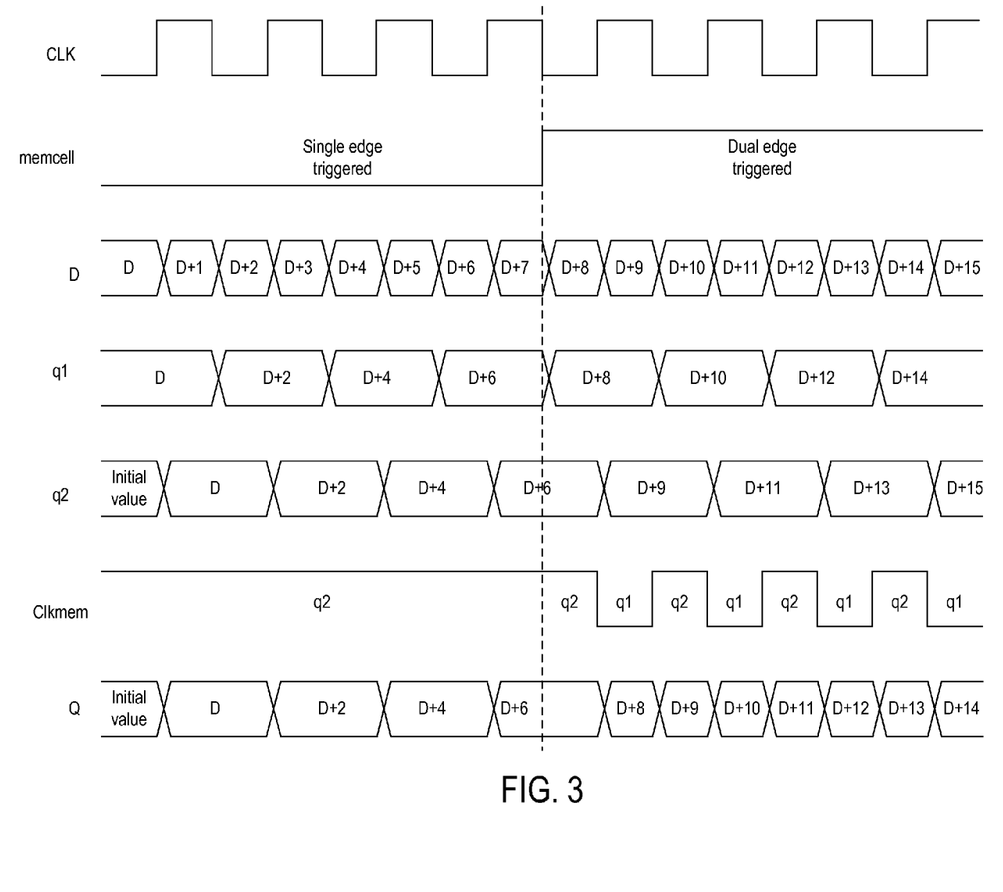
FIG. 3 shows an example set of signal values during operation of the configurable latch circuit shown in FIG. 1, consistent with one or more implementations.

FIG. 3 shows waveforms for an example set of signal values during operation of the configurable latch circuit shown in FIG. 1. The waveforms show example values of CLK, memcell, Clkmem, D, q1, q2, and Q during operation of the configurable latch circuit shown in FIG. 1. In this example, the configurable latch circuit operates as a single-edge-triggered latch when memcell is set to logic 0 and operates as a dual-edge-triggered latch when memcell is set to logic 1. To facilitate explanation of operation, input signal D is sub-divided into symbols that are approximately half of the length of the one cycle of the clock Clk.

When memcell is set to logic 0, latch 120 sets its output q1 to a value of the input signal D when Clk is set to logic 0 and holds the value at output q1 when Clk is set to logic 1. As a result, latch 120 stores even numbered symbols of input signal D. As shown in TABLE 1, Clkmem is set at logic 1 when memcell is set to logic 0 and output Q is connected to the output of q2. As described with reference to FIG. 1, an input d2 of latch 140 is connected to q1 when memcell is set to logic 0 and sets its outputs q2 and Q to the value of q1 when Clk is set to logic 1 and holds the value of q2 when Clk is set to logic 0. As a result, the configurable latch circuit is operated as a single-edge-triggered latch When memcell is set to logic 1, latch 120 sets its output q1 to a value of the input signal D when Clk is set to logic 0 and holds the value at output q1 when Clk is set to logic 1 as previously described. Input d2 of latch 140 is connected to the input D and sets its output q2 to a value of the input signal D when Clk is set to logic 1 and holds the value of q2 when Clk is set to logic 0. As a result, latch 120 stores even numbered symbols of input signal D, as previously described, and latch 140 stores odd numbered symbols of input signal D. As shown in TABLE 1, when memcell is set to logic 1, Clkmem, is set to logic 1 when Clk is set to logic 0 and is set to logic 0 to when Clk is set to logic 1. Multiplexer 150, connects output Q to q1 when Clkmem is logic 0 and to q2 when Clkmem is logic. As a result, the configurable latch circuit is operated as a dual-edge-triggered latch.

Figure 4:
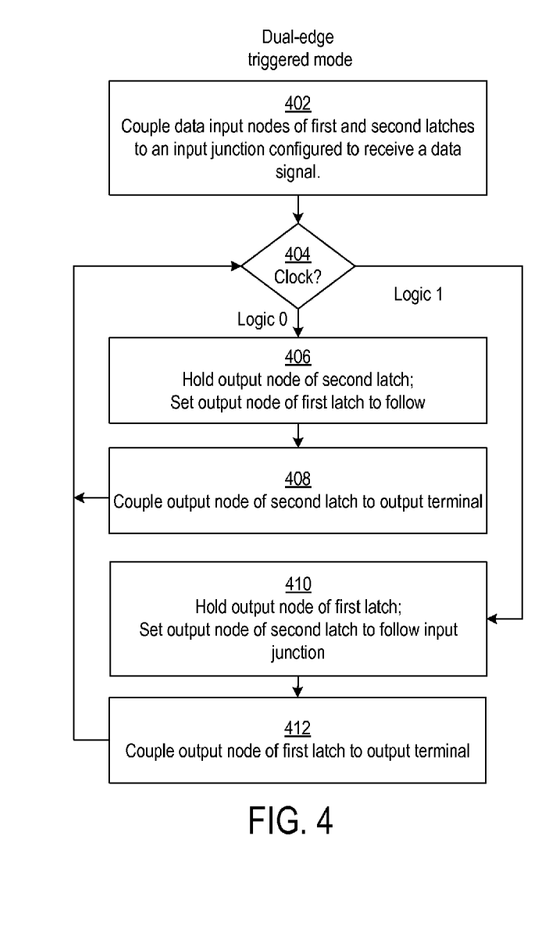
FIG. 4 shows an example process for operating the configurable latch circuit in FIG. 1 as a dual-edge-triggered latch.

FIG. 4 shows an example process for operating the configurable latch circuit in FIG. 1 as a dual-edge-triggered latch. At block 402, data input nodes of first and second logic circuits are coupled to an input junction configured to receive a data signal. If a clock signal is set to a logic 0, decision block 404 directs the process to block 406. At block 406, the first latch is configured to follow the input junction and the second latch is configured to hold the value of its output node. At block 408, the data output node of the second latch is coupled to the output terminal. During this portion of the clock cycle, the first latch operates as a transparent master latch and the second latch operates as a latched slave latch. When the clock signal becomes set to logic 1, decision block 404 directs the process to block 410. At block 410, the process configures the first latch to hold the value of its output node and configures the second latch to follow the input junction. At block 412, the data output node of the second latch is coupled to the output terminal. During this portion of the clock cycle, the second latch operates as a transparent master latch and the first latch operates as a latched slave latch.

Figure 5:
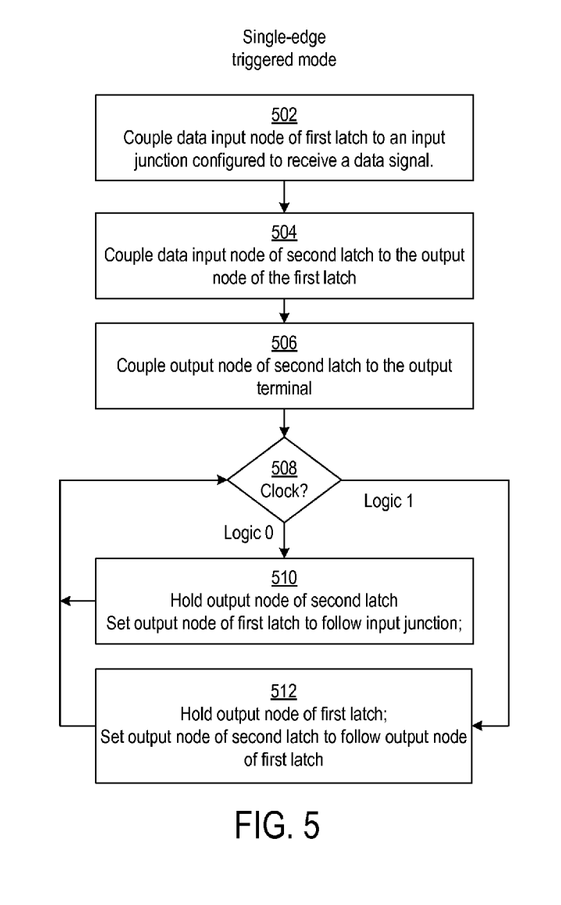
FIG. 5 shows an example process for operating the configurable latch circuit in FIG. 1 as a single-edge-triggered latch.

FIG. 5 shows an example process for operating the configurable latch circuit in FIG. 1 as a single-edge-triggered latch. At block 502, the data input node of the first latch is coupled to the input junction. At block 504, the data input node of the second latch is coupled to the data output node of the first latch. At block 506, the data output node of the second latch is coupled to an output terminal. In this configuration, the first latch operates as a master latch and the second latch operates as a slave latch. If a clock signal is set to a logic 0, decision block 508 directs the process to block 510. At block 510, the second latch is set to hold the current value at its output node and the first latch is configured to follow the input junction. When the clock signal becomes set to a logic 1, decision block 508 directs the process to block 512. At block 512, the first latch is set to hold the current value at its output node and the second latch is configured to follow the output of the first latch.

Figure 6:
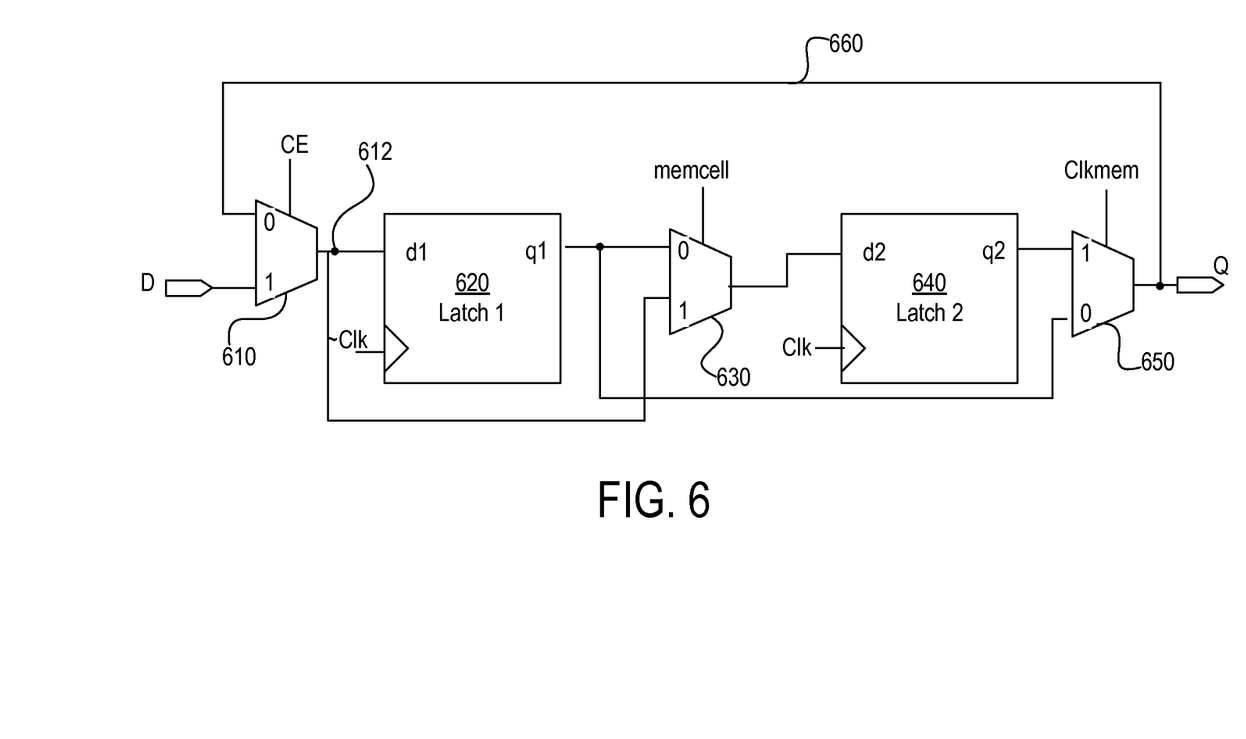
FIG. 6 shows a second configurable latch circuit, consistent with one or more implementations.

FIG. 6 shows a second configurable latch circuit, consistent with one or more implementations. The circuit includes a pair of latches 620 and 640 and a pair of multiplexers 630 and 650 interconnected and configured as described with reference to latches 120 and 140 and multiplexers 130 and 160 shown in FIG. 1. In this example, the circuit includes a multiplexer 610 configured to select input data provided to input junction 612. The multiplexer 610 has a first input node coupled to an input terminal (D), a second input node coupled to a feedback path 660 from an output terminal (Q), and an output node coupled to input junction 612. In response to a control signal CE being set to logic 1, the multiplexer 610 couples the input terminal to the input junction 612. In response to a control signal CE being set to logic 0, the multiplexer 610 couples the feedback path 660 to the input junction 612. Coupling the feedback path 660 to the input junction 612 allows a value to be held in the configurable latch circuit for multiple clock cycles.

Figure 7:
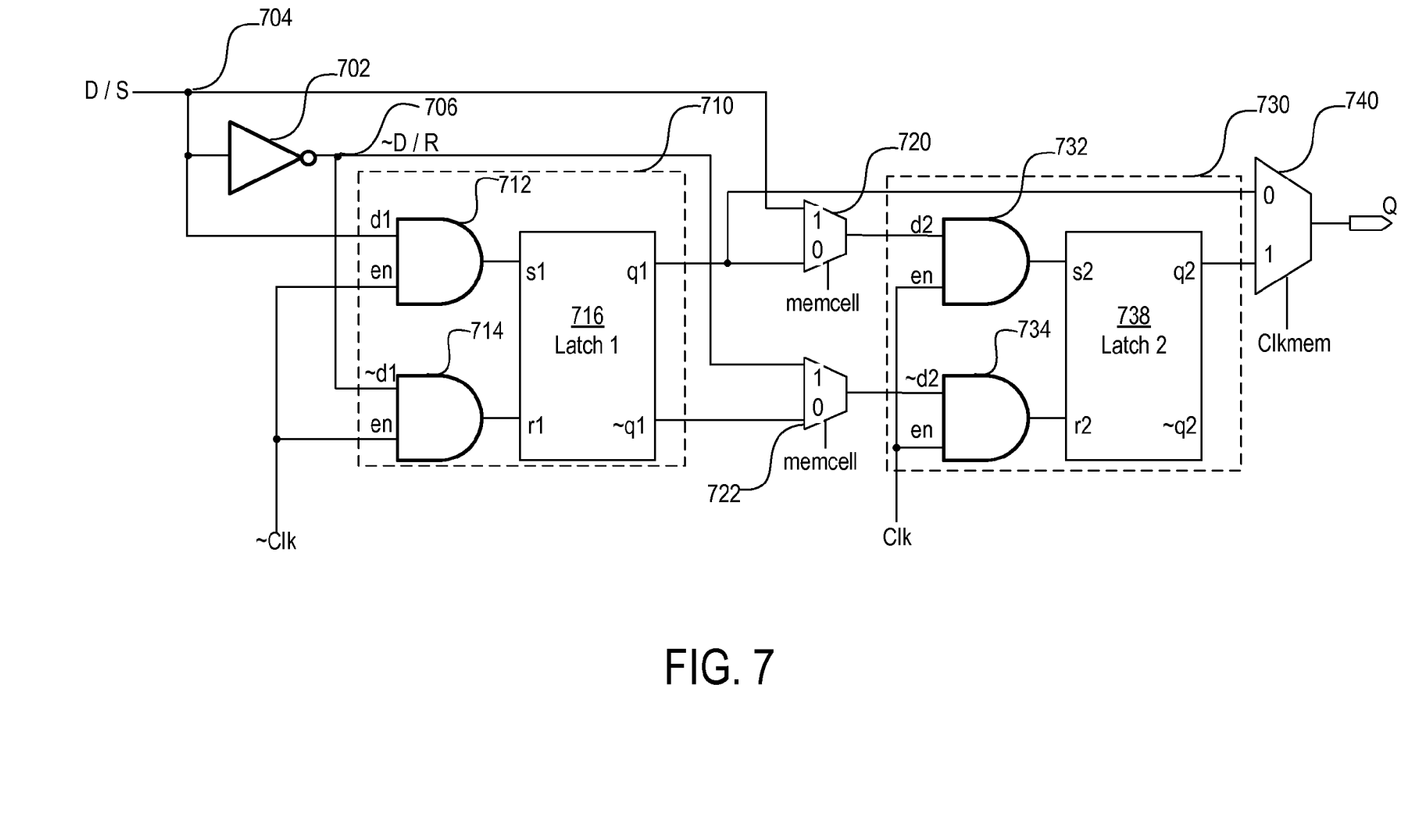
FIG. 7 shows a third configurable latch circuit, consistent with one or more implementations.

For ease of description, the above examples are primarily illustrated and described with reference to configurable latching circuits formed by respective pairs of level-sensitive D-latches. However, the examples may be adapted to use with various other types of latches. As an illustrative example, FIG. 7 shows a configurable latch circuit formed using a pair of set-reset (SR) latches, consistent with one or more implementations.

In this example, a first gated SR latch 710 is formed by SR latch 716 in combination with AND gates 712 and 714. The gated SR latch 716 changes values of the output nodes q1 and ~q1 responsive to input nodes d1 and ~d1 when a clock signal provided to an enable input node is set to logic 1. When the clock signal provided to an enable input node is set to logic 0, the values of output nodes q1 and ~q1 are not responsive to input nodes d1 and ~d1. A first AND gate 712 has a first input node coupled to receive an input data signal (D/S) and a second input node coupled to receive the inverted clock signal (~Clk). The first AND gate 712 is configured to set the latch 716 in response to both the input data signal D/S and the inverted clock ~Clk being set to logic 1. The second AND gate 714 is configured to reset the latch 716 in response to an inverted input data signal (~D/R) and the inverted clock ~Clk being set to logic 1. A second gated SR latch 730 is formed by SR latch 738 in combination with AND gates 732 and 734. When the clock signal provided to an enable input node is set to logic 0, the values of output nodes q2 and ~q2 are not responsive to input nodes d2 and ~d2. AND gate 732 is configured to set the latch 738 in response to both the input data signal D/S and the clock signal Clk being set to logic 1. AND gate 734 is configured to reset the latch 738 in response to the inverted input data signal (~D/R) and the clock signal Clk being set to logic 1.

In this example, the configurable latch circuit also includes a first multiplexer 720 configured to selectably couple the input node s2 of the second latch 738 to the output node (q1) of the first latch 716 or to a first input junction 704 in response to the memcell control signal. The first input junction 704 is coupled to receive the input data signal D/S. A second multiplexer 722 is configured to selectably couple the input node r2 of the second latch 738 to the output node (~q1) of the first latch 716 or to a second input junction 706 in response to the memcell control signal. The second input junction 706 is coupled to receive an inverted data signal ~D/R output by inverter 702. A third multiplexer 740 is configured to selectably couple an output terminal (Q) to either an output node (q1) of the first latch 716 or an output node (q2) of the second latch 738 in response to the Clkmem control signal as discussed with reference to multiplexer 150 in FIG. 1. During operation, the first and second latch circuits 710 and 730 latch values of an input data signal D and provide latched values to output Q as described with reference to latches 120 and 140 in FIG. 1 and the example set of signal values shown in FIG. 3.

The configurable latch circuits may be adapted for use in a number of applications that utilize latching circuits. The configurable latch circuits are thought to be particularly applicable for use in programmable integrated circuits (ICs) which may be programmed for various applications. One type of PLD, the field programmable gate array (FPGA), typically includes an array of programmable tiles. These programmable tiles comprise various types of logic blocks, which can include, for example, the disclosed configurable latching circuits, input/output blocks (IOBs), dedicated random access memory blocks (BRAM), multipliers, digital signal processing blocks (DSPs), processors, clock managers, delay lock loops (DLLs), bus or network interfaces. The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Figure 8:
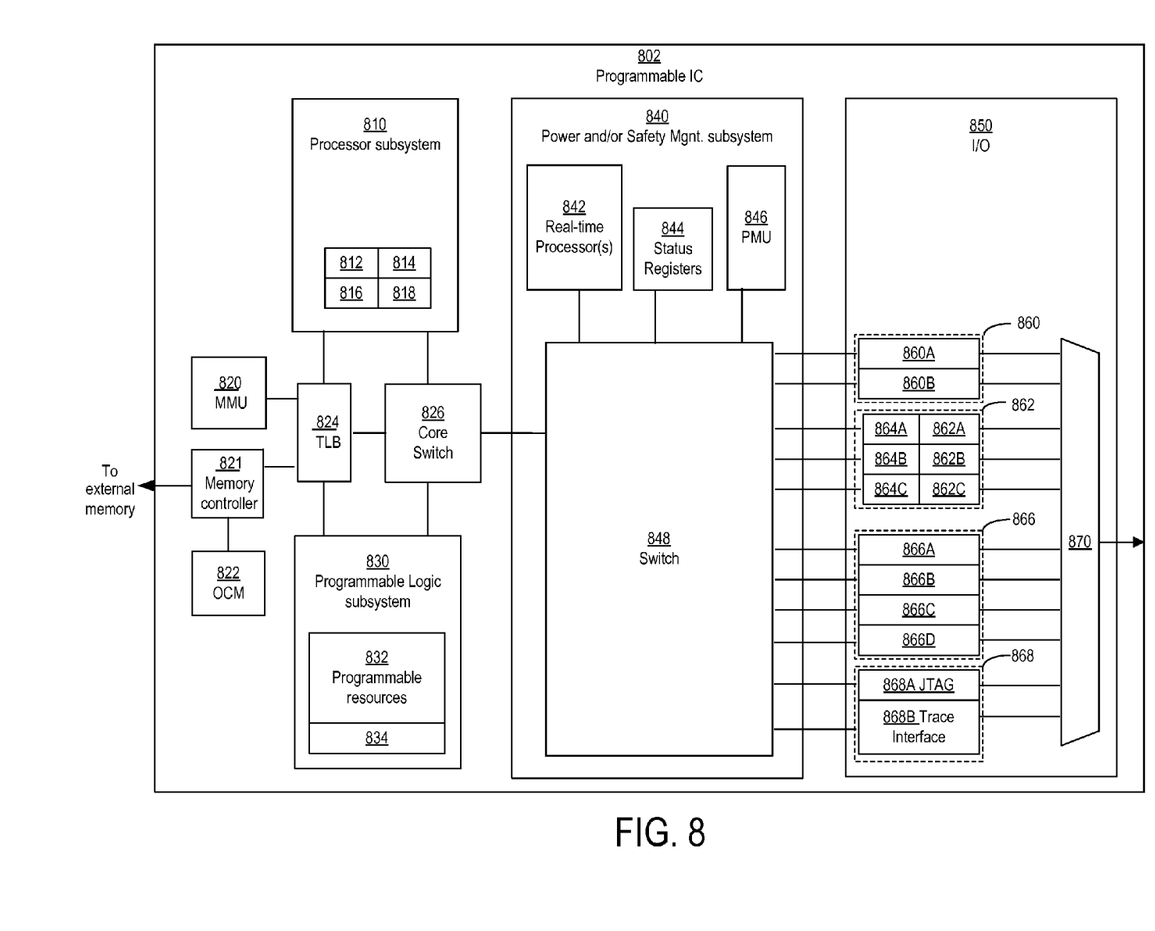
FIG. 8 shows an example programmable IC that may be adapted to include the disclosed configurable latch circuits, consistent with one or more implementations.

FIG. 8 shows a programmable IC 802 that may be configured in accordance with one or more implementations. The programmable IC may also be referred to as a System On Chip (SOC), which includes a processor subsystem 810 and a programmable logic subsystem 830. The processor subsystem 810 may be programmed to implement a software portion of the user design, via execution of a user program. The program may be specified as part of a configuration data stream or may be retrieved from an on-chip or off-chip data storage device. The processor subsystem 810 may include various circuits 812, 814, 816, and 818 for executing one or more software programs. The circuits 812, 814, 816, and 818 may include, for example, one or more processor cores, floating point units (FPUs), an interrupt processing unit, on chip-memory, memory caches, and/or cache coherent interconnect.

The programmable logic subsystem 830 of the programmable IC 802 may be programmed to implement a hardware portion of a user design. For instance, the programmable logic subsystem may include a number of programmable resources 832, which may be programmed to implement a set of circuits specified in a configuration data stream. The programmable resources 832 include, for example, programmable interconnect circuits, programmable logic circuits (e.g., configurable latch circuits), and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 832 may be programmed by loading a configuration data stream into the configuration memory cells, which define how the programmable interconnect circuits and programmable logic circuits are configured. For example, setting a configuration memory cell for a configurable latch to a first value may direct the configurable latch to operate as a single-edge-driven latch. Setting the configuration memory cell to a second value may direct the configurable latch to operate as a double-edge-driven latch. The collective states of the individual memory cells then determine the function of the programmable resources 832. The configuration data can be read from memory (e.g., from an external PROM) or written into the programmable IC 802 by an external device. In some implementations, a configuration controller 834 included in the programmable logic subsystem 830 may program the programmable resources, in response to powering on the programmable IC, by retrieving configuration data from a non-volatile memory coupled to the programmable IC and loading the configuration data into the configuration memory cells. In some other implementations, the configuration data may be loaded into the configuration memory cells by a start-up process executed by the processor subsystem 810.

The programmable IC 802 may include various circuits to interconnect the processor subsystem 810 with circuitry implemented within the programmable logic subsystem 830. In this example, the programmable IC 802 includes a core switch 826 that can route data signals between various data ports of the processor subsystem 810 and the programmable logic subsystem 830. The core switch 826 may also route data signals between either of the programmable logic or processing subsystems 810 and 830 and various other circuits of the programmable IC, such as an internal data bus. Alternatively or additionally, the processor subsystem 810 may include an interface to directly connect with the programmable logic subsystem—bypassing the core switch 826. Such an interface may be implemented, for example, using the AMBA AXI Protocol Specification (AXI) as published by ARM.

In some implementations, the processor subsystem 810 and the programmable logic subsystem 830 may also read or write to memory locations of an on-chip memory 822 or off-chip memory (not shown) via memory controller 821. The memory controller 821 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 821 is able to communicate is provided for purposes of illustration only and is not intended as a limitation or to be exhaustive. As shown in FIG. 8, the programmable IC 802 may include a memory management unit 820 and translation look-aside buffer 824 to translate virtual memory addresses used by the subsystems 810 and 830 to physical memory addresses used by the memory controller 821 to access specific memory locations.

The programmable IC may include an input/output (I/O) subsystem 850 for communication of data with external circuits. The I/O subsystem 850 may include various types of I/O devices or interfaces including for example, flash memory type I/O devices, higher performance I/O devices, lower performance interfaces, debugging I/O devices, and/or RAM I/O devices.

The I/O subsystem 850 may include one or more flash memory interfaces 860 illustrated as 860A and 860B. For example, one or more of flash memory interfaces 860 can be implemented as a Quad-Serial Peripheral Interface (QSPI) configured for 4-bit communication. One or more of flash memory interfaces 860 can be implemented as a parallel 8-bit NOR/SRAM type of interface. One or more of flash memory interfaces 860 can be implemented as a NAND interface configured for 8-bit and/or 16-bit communication. It should be appreciated that the particular interfaces described are provided for purposes of illustration and not limitation. Other interfaces having different bit widths can be used.

The I/O subsystem 850 can include one or more interfaces 862 providing a higher level of performance than flash memory interfaces 860. Each of interfaces 862A-862C can be coupled to a DMA controller 864A-864C respectively. For example, one or more of interfaces 862 can be implemented as a Universal Serial Bus (USB) type of interface. One or more of interfaces 862 can be implemented as a gigabit Ethernet type of interface. One or more of interfaces 862 can be implemented as a Secure Digital (SD) type of interface.

The I/O subsystem 850 may also include one or more interfaces 866 such as interfaces 866A-866D that provide a lower level of performance than interfaces 862. For example, one or more of interfaces 866 can be implemented as a General Purpose I/O (GPIO) type of interface. One or more of interfaces 866 can be implemented as a Universal Asynchronous Receiver/Transmitter (UART) type of interface. One or more of interfaces 866 can be implemented in the form of a Serial Peripheral Interface (SPI) bus type of interface. One or more of interfaces 866 can be implemented in the form of a Controller-Area-Network (CAN) type of interface and/or an $I^2C$ type of interface. One or more of interfaces 866 also can be implemented in the form of a timer type of interface.

The I/O subsystem 850 can include one or more debug interfaces 868 such as processor JTAG (PJTAG) interface 868A and a trace interface 868B. PJTAG interface 868A can provide an external debug interface for the programmable IC 802. Trace interface 868B can provide a port to receive debug, e.g., trace, information from the processor subsystem 810 or the programmable logic subsystem 830.

As shown, each of interfaces 860, 862, 866, and 868 can be coupled to a multiplexer 870. Multiplexer 870 provides a plurality of outputs that can be directly routed or coupled to external pins of the programmable IC 802, e.g., balls of the package within which the programmable IC 802 is disposed. For example, I/O pins of programmable IC 802 can be shared among interfaces 860, 862, 866, and 868. A user can configure multiplexer 870, via a configuration data stream to select which of interfaces 860-868 are to be used and, therefore, coupled to I/O pins of programmable IC 802 via multiplexer 870. The I/O subsystem 850, may also include a fabric multiplexer I/O (FMIO) interface (not shown) to connect interfaces 862-868 to programmable logic circuits of the programmable logic subsystem. Additionally or alternatively, the programmable logic subsystem 830 can be configured to implement one or more I/O circuits within programmable logic. In some implementations, the programmable IC 802 may also include a subsystem 840 having various circuits for power and/or safety management. For example, the subsystem 840 may include a power management unit 846 configured to monitor and maintain one or more voltage domains used to power the various subsystems of the programmable IC 802. In some implementations, the power management unit 846 may disable power of individual subsystems, when idle, to reduce power consumption, without disabling power to subsystems in use.

The subsystem 840 may also include safety circuits to monitor the status of the subsystems to ensure correct operation. For instance, the subsystem 840 may include one or more real-time processors 842 configured to monitor the status of the various subsystems (e.g., as indicated in status registers 844). The real-time processors 842 may be configured to perform a number of tasks in response to detecting errors. For example, for some errors, the real-time processors 842 may generate an alert in response to detecting an error. As another example, the real-time processors 842 may reset a subsystem to attempt to restore the subsystem to correct operation. The subsystem 840 includes a switch network 848 that may be used to interconnect various subsystems. For example, the switch network 848 may be configured to connect the various subsystems 810, 830, and 840 to various interfaces of the I/O subsystem 850. In some applications, the switch network 848 may also be used to isolate the real-time processors 842 from the subsystems that are to be monitored. Such isolation may be required by certain application standards (e.g., IEC-61508 SIL3 or ISO-26262 standards) to ensure that the real-time processors 842 are not affected by errors that occur in other subsystems.

The methods and circuits are thought to be applicable to a variety of systems that utilize latching circuits. Other aspects and features will be apparent to those skilled in the art from consideration of the specification. For instance, although aspects and features may in some cases be described in individual figures, it will be appreciated that features from one figure can be combined with features of another figure even though the combination is not explicitly shown or explicitly described as a combination. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:
1. A configurable latch circuit, comprising:
first and second latch circuits, each latch circuit having a respective data input node, a respective data output node, and a respective clock input node, wherein each latch circuit is configured to:
set a value of a signal at the respective data output node to a value of a signal at the data input node while the signal at the respective clock input node is set to a first value, and
hold the value of the signal at the respective data output node while the signal at the respective clock input node is set to a second value;
a circuit coupled to the first and second latch circuits and configured to provide a first clock signal to the clock input node of the second latch circuit and provide a second clock signal that is an inversion of the first clock signal to the clock input node of the first latch circuit; and
a first multiplexer having a first input node coupled to the data output node of the first latch circuit, a second input node coupled to the data input node of the first latch circuit, and an output node coupled to the data input node of the second latch circuit; and
a second multiplexer having a first input node coupled to the data output node of the first latch circuit and a second input node coupled to the data output node of the second latch circuit.

2. The configurable latch circuit of claim 1, wherein the first and second multiplexers are configured to:
operate the first and second latch circuits as a single-edge-triggered latch in response to a control signal having the second value; and
operate the first and second latch circuits as a single-edge-triggered latch in a first mode and as a double-edge-triggered latch in response to the control signal having the first value.

3. The configurable latch circuit of claim 2, further comprising:
an output terminal; and
a control circuit coupled to the first and second multiplexers and configured to:
set the first multiplexer to couple the data output node of the first latch circuit to the data input node of the second latch circuit in response to a control signal having the second value; and
set the first multiplexer to couple an input junction to the data input node of the second latch circuit in response to the control signal having the first value;
set the second multiplexer to couple the data output node of the second latch circuit to the output terminal in response to the control signal having the second value;
set the second multiplexer to couple the data output node of the first latch circuit to the output terminal in response to the control signal having the first value and the first clock signal having the first value; and
set the second multiplexer to couple the data output node of the second latch circuit to the output terminal in response to the control signal having the first value and the first clock signal having the second value.

4. The configurable latch circuit of claim 3, wherein the control circuit includes, a logical NAND having a first input node coupled to receive the first clock signal, a second input node coupled to receive the control signal, and an output node coupled to a selection input node of the second multiplexer.

5. The configurable latch circuit of claim 1, further comprising:
an input terminal; and
a third multiplexer having a first input node coupled to an output node of the second multiplexer, a second input node coupled to the input terminal, and an output node coupled to the data input nodes of the first and second latch circuits.

6. The configurable latch circuit of claim 1, wherein the first and second latch circuits are level-sensitive latches.

7. The configurable latch circuit of claim 6, wherein the first and second latch circuits are D-latches.

8. The configurable latch circuit of claim 1, further comprising:
an input terminal;
an inverter circuit having an input node coupled to the input terminal;
wherein the first latch circuit includes:
  a first SR latch having a set input node and a reset input node;
  a first logical AND circuit having a first input node coupled to the data input node, a second input node coupled to the first clock signal, and an output node coupled to the set input node of the first SR latch; and
  a second logical AND circuit having a first input node coupled to an output node of the inverter circuit, a second input node coupled to the first clock signal, and an output node coupled to the reset input node of the first SR latch.

9. The configurable latch circuit of claim 8, further comprising:
a third multiplexer having a first input node coupled to an inverted output node of the first SR latch, and a second input node coupled to an inverted input junction of the configurable latch circuit;
wherein the first input node of the first multiplexer is coupled to a non-inverted output node of the first SR latch, the second input node of the first multiplexer is coupled to a non-inverted input junction of the configurable latch circuit; and
wherein the second latch circuit includes:
  a second SR latch having a set input node and a reset input node;
  a third logical AND circuit having a first input node coupled to an output node of the first multiplexer, a second input node coupled to the second clock signal, and an output node coupled to the set input node of the second SR latch; and
  a second logical AND circuit having a first input node coupled to an output node of the third multiplexer, a second input node coupled to the second clock signal, and an output node coupled to the reset input node of the second SR latch.

10. A method, comprising,
coupling a data input node of a first latch and a data input node of a second latch to an input junction;
using the first latch, while a clock signal is set to a first value, latching a data output node of the first latch to a value present at the data input node of the first latch during a transition of the clock signal from a second value to the first value;
using the second latch, while the clock signal is set to the second value, latching a data output node of the second latch to a value present at the data input node of the second latch during a transition of the clock signal from the first value to the second value;
coupling the data output node of the first latch to an output terminal in response to the clock signal being set to the first value; and
coupling the data output node of the second latch to the output terminal in response to the clock signal being set to the second value.

11. The method of claim 10, wherein the coupling steps are performed in response to a control signal being set to the first value.

12. The method of claim 11, further comprising, in response to the control signal being set to the second value operating the first and second latch circuits as a single-edge-triggered latch.

13. The method of claim 12, wherein the operating of the first and second latch circuits as a single-edge-triggered latch includes:
coupling the data input node of the first latch to the input junction; and
coupling the data input node of the second latch to the data output node of the first latch.

14. The method of claim 13, wherein operating of the first and second latch circuits as a single-edge-triggered latch further includes coupling the data output node of the second latch to the output terminal.

15. The method of claim 10, further comprising, in response to a second control signal providing a feedback path from the output terminal to the input junction.

16. A programmable integrated circuit (IC), comprising:
programmable logic circuits;
programmable interconnect circuits; and
a configuration controller configured to program the programmable logic circuits and programmable interconnect circuits according to a set of configuration data stored in a non-volatile memory coupled to the programmable IC; and
wherein the programmable logic circuits include a configurable latch circuit, having:
  first and second latch circuits, each latch circuit having a respective data input node, a respective data output node, and a respective clock input node, wherein each latch circuit is configured to:
    while the respective clock input node is set to a first value (logic 1), set a value of the respective data output node to a value of the data input node, and
    while the respective clock input node is set to a second value, hold the value of the data output node;
  a circuit coupled to the first and second latch circuits and configured to provide a first clock signal to the clock input node of the second latch circuit and provide a second clock signal that is an inversion of the first clock signal to the clock input node of the first latch circuit; and
  a first multiplexer having a first input node coupled to the data output node of the first latch circuit, a second input node coupled to the data input node of the first latch circuit, and an output node coupled to the data input node of the second latch circuit; and
  a second multiplexer having a first input node coupled to the data output node of the first latch circuit and a second input node coupled to the data output node of the second latch circuit.

17. The programmable IC of claim 16, wherein the first multiplexer is configured to:
couple the data output node of the first latch circuit to the data input node of the second latch circuit in response to a control signal having the second value; and couple an input junction to the data input node of the second latch circuit in response to the control signal having the first value.

18. The programmable IC of claim 17, wherein the configurable latch circuit further comprises:
   an output terminal; and
   a control circuit coupled to the first multiplexer and configured to:
      set the second multiplexer to couple the data output node of the second latch circuit to the output terminal in response to the control signal having the second value;
      set the second multiplexer to couple the data output node of the first latch circuit to the output terminal in response to the control signal having the first value and the first clock signal having the first value; and
      set the second multiplexer to couple the data output node of the second latch circuit to the output terminal in response to the control signal having the first value and the first clock signal having the second value.

19. The programmable IC of claim 18, wherein the control circuit includes, a logical NAND having a first input node coupled to receive the first clock signal, a second input node coupled to receive the control signal, and an output node coupled to a selection input node of the second multiplexer.

20. The configurable latch circuit of claim 16, wherein the configurable latch circuit further comprises:
   an input terminal; and
   a third multiplexer having a first input node coupled to an output node of the second multiplexer, a second input node coupled to the input terminal, and an output node coupled to the data input nodes of the first and second latch circuits.

* * * * *